United States Patent [19]
Azuchi

[11] Patent Number: 4,649,459
[45] Date of Patent: Mar. 10, 1987

[54] ROTARY ELECTRIC DEVICES
[75] Inventor: Yukihiro Azuchi, Sabae, Japan
[73] Assignee: Murata Manufacturing Co., Ltd., Japan
[21] Appl. No.: 678,696
[22] Filed: Dec. 6, 1984
[30] Foreign Application Priority Data
  Dec. 12, 1983 [JP] Japan .................. 58-234685
[51] Int. Cl.[4] ............................................. H01G 5/06
[52] U.S. Cl. .................................................... 361/293
[58] Field of Search ............... 361/293, 292, 287, 300; 354/64; 338/73, 164, 233, 237; 215/232; 156/329

[56] References Cited
U.S. PATENT DOCUMENTS

| | | | |
|---|---|---|---|
| 3,346,435 | 10/1967 | Beck | 156/423 |
| 3,354,603 | 11/1967 | Katzew et al. | 53/30 |
| 3,355,693 | 11/1967 | Van Benthuysen et al. | 338/164 X |
| 3,817,417 | 6/1974 | Edwards | 215/232 |
| 4,056,842 | 11/1977 | Sienicki et al. | 361/293 |
| 4,079,567 | 3/1978 | Spruyt et al. | 53/14 |
| 4,101,951 | 7/1978 | Kuze | 361/300 X |
| 4,179,722 | 12/1979 | Johanson | 361/293 |
| 4,291,361 | 9/1981 | Shirakawa | 361/293 |
| 4,339,486 | 7/1982 | Shimamoto et al. | 156/329 X |
| 4,390,859 | 6/1983 | Kasprzyk et al. | 338/164 X |
| 4,421,705 | 12/1983 | Hatakeyama et al. | 264/153 |

FOREIGN PATENT DOCUMENTS

| | | | |
|---|---|---|---|
| 121203 | 3/1946 | Australia | 361/293 |
| 626439 | 8/1961 | Canada . | |
| 1137026 | 5/1957 | France . | |
| 148115 | 11/1980 | Japan . | |
| 58-72353 | 4/1983 | Japan . | |

Primary Examiner—Donald A. Griffin
Attorney, Agent, or Firm—Ostrolenk, Faber, Gerb & Soffen

[57] ABSTRACT

A cover sheet for sealingly covering the rotatable head of an adjustable electric device such as a potentiometer, trimmable capacitor or the like. The cover sheet is provided over a screwdriver opening through which the device's capacitance, resistance or the like is set. The cover sheet is formed at the opening and is bonded to the inner peripheral surface of an edge portion which defines the opening. Thereby, the rotary electric device is closed. The cover sheet is preferably formed of a silicone adhesive material.

17 Claims, 11 Drawing Figures

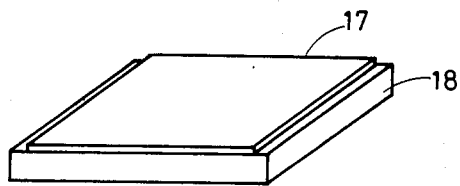
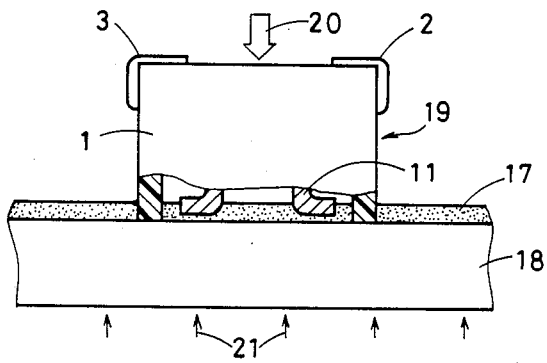
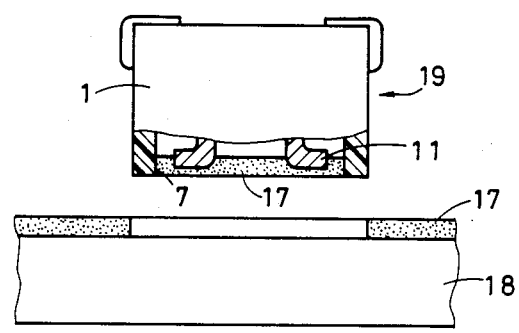
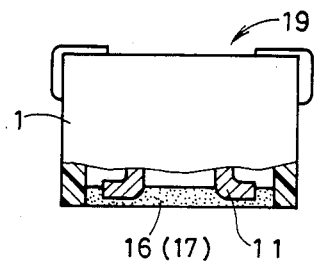
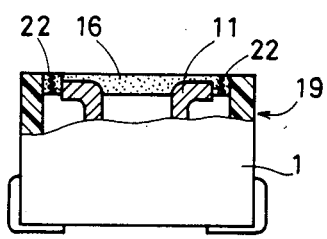

ROTARY ELECTRIC DEVICES

BACKGROUND OF THE INVENTION

The present invention relates to a cover sheet which covers the rotatable means of adjustable electronic devices such as potentiometers or the like. Conventionally, such electrical devices include rotor means and stator means contained in a case. The rotor means are exposed and therefore require special handling precautions during the manufacturing process. Examples of such a rotary electric device are a trimmer capacitor, a variable resistors, variable coils and rotary switches. The present invention may be applied to any type of such rotary electric devices.

A rotary electric device comprises a rotary mechanism portion including a rotor means and a stator means contained in a case. In such a rotary electric device, the rotor means is rotated to change, e.g., the capacity in a trimmer capacitor or the resistance value in a variable resistor. Therefore, the case of the rotary electric device is provided with an opening for performing desired adjustment by changing characteristics of the rotary electric device from the exterior thereof, wherefore the rotor means is rotated through the opening.

Generally when a rotary electric device is mounted on a printed circuit board etc., flux employed in soldering may enter the case through the opening formed therein and this produces undesirable effects which alter the characteristics of the rotary electric device. Further, for improving workability and reducing production costs, it is desired to pass all of electric or electronic components through a molten solder tank thereby to simultaneously solder a plurality of electric or electronic components on the printed circuit board etc. In this case, however, the solder inevitably enters the rotary electric device through the opening formed in the case to disadvantageously influence the rotor means and stator means etc., and as the result, for example, rotation of the rotor means might be prevented and the response characteristics of a dielectric member or resistance film serving as the stator means might be degraded. Thus, the soldering of a rotary electric device such as a trimmer capacitor always had to be carried out separately and after the printed circuit board has gone through the solder tank.

In this regard, there has been provided the so-called closed type rotary electric device to which a cover sheet is applied to close an opening defined in its case thereby to prevent entry of flux and solder during the assembly thereof. Such a closed type rotary electric device is disclosed in, for example, Japanese patent laying-open gazette No. 72353/1983, published on Apr. 30, 1983. In this document, a heat-resistant cover sheet of polyimide resin is disclosed to be applied to the outer surface of the case to close an opening defined therein by a heat-resistant adhesive. In the closed type rotary electric device, therefore, entry of flux or solder is prevented during the different production and assembly phases of the device. This enables simultaneous soldering of the rotary electric device with other electric or electronic components.

The cover sheet is made of material having such thickness and strength that it can be easily broken by a screwdriver etc., and hence the rotor means can be readily rotated by the screwdriver etc. with the cover sheet being broken by the same when it is necessary to rotate the rotor means of the rotary electric device.

However, in the aforementioned arrangement, it has been difficult to apply the cover sheet to the case of the rotary electric device. When a plurality of cover sheets are applied one by one to small-sized rotary electric devices of, e.g., several millimeters square, the sizes of the rotary electric devices and the cover sheets are too small to process, and hence it is extremely difficult to apply such cover sheets to the small-sized rotary electric devices. Although, it is possible to prepare a large-sized cover sheet member and apply it to a plurality of rotary electric devices, the large-sized cover sheet member must be cut after application to the devices to provide an individual cover for each device. It is troublesome to cut the cover sheet member along the outer peripheries of cases of the rotary electric devices. Further, the thickness or the height of the rotary electric device is increased by application of the cover sheet, and such increase in size is not desirable particularly in a small-sized rotary electric device. Further, when a cover sheet made of polyimide resin is broken as the rotor is rotated, the fragments of the cover sheet may enter the case.

SUMMARY OF THE INVENTION

Accordingly, an object of the present invention is to provide structure of the so-called closed type rotary electric device which can overcome the aforementioned disadvantages of the prior art.

A rotary electric device according to the present invention comprises a rotary mechanism portion including rotor means and stator means contained in a case, which in turn is provided with an opening for receiving a tool for rotating the rotor means. The opening provided in the case is closed by a cover sheet, which is formed in a state bonded to the inner peripheral surface of an edge portion defining the opening in the case.

According to the present invention, a rotary electric device with an enclosed opening is produced by applying a cover sheet to the device. The cover sheet is formed at and bonded to the inner peripheral surface of the edge portion of the opening defined in the case, and hence it is possible to provide the cover sheet with no projection extending from the outer surface of the case. Thus, the cover sheet does not increase the thickness or height of the rotary electric device. Further, the material for or the thickness of the cover sheet can be so selected that the cover sheet will not prevent rotation of the rotor means. In other words, the cover sheet may be formed to be easily broken, extended or brought in a mixed state in which the same is partially extended and partially broken when the rotor means is rotated.

Further, formation of the cover sheet of the present invention can be efficiently carried out by utilizing the change in the state of an appropriate resin material which changes from an unhardened state to a hardened state as clearly understood from the following description of the preferred embodiments.

The above and other objects, features, aspects and advantages of the present invention will become more apparent from the following detailed description of embodiments of the the present invention when taken in conjunction with the accompanying drawings.

BRIEF DESCRIPTION OF THE DRAWINGS

FIGS. 3 to 6 are illustrations successively showing steps of forming a cover sheet 16 embodying aspects of the present invention;

FIG. 7 is a partially fragmented front elevational view showing a state in which the cover sheet 16 is broken upon adjustment;

DESCRIPTION OF THE PREFERRED EMBODIMENTS

Figure 1:
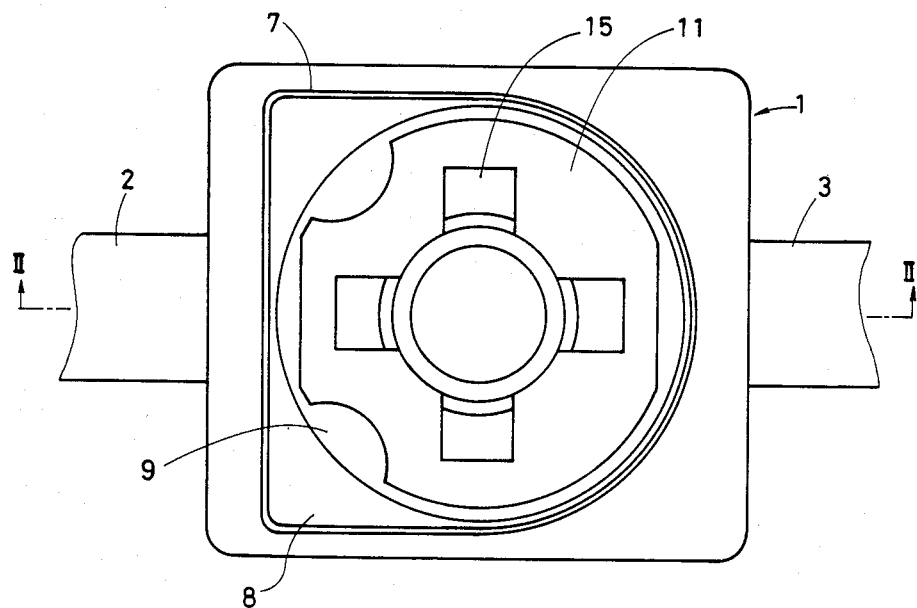
FIG. 1 is a plan view showing a trimmer capacitor according to an embodiment of the present invention.
Figure 2:
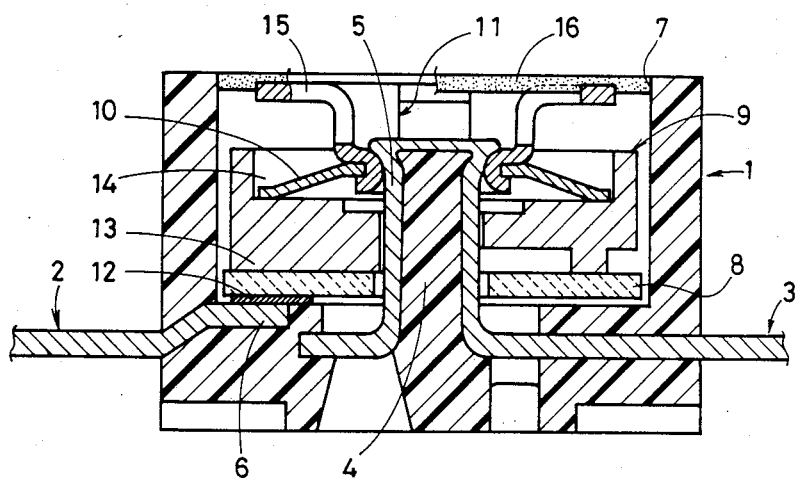
FIG. 2 is a cross-sectional view taken along the line II—II in FIG. 1.

FIG. 1 is a plan view showing a trimmer capacitor according to an embodiment of the present invention, and FIG. 2 is a cross-sectional view taken along the line II—II in FIG. 1.

A case 1 of the rotary electric device is formed with two terminals 2 and 3 embedded in the same. The case 1 is made of material resistant to a high temperature for melting solder, such as heat-resistant thermosetting resin which is resistant to a temperature of about 300° C. An end of the terminal 3 located in the case 1 is shaped to receive a center shaft 4 within the case 1 and for forming a cylindrical portion 5 defining a cylindrical outer peripheral surface around the center shaft 4. The center shaft 4 is formed by filling up the cylindrical portion 5 with resin when the terminal 3 including the cylindrical portion 5 is integrally molded with the case 1. An end 6 of the terminal 2 located in the case 1 is so provided as to be partially exposed from the bottom surface of the case 1. The terminals 2 and 3 respectively extend outwardly from the case 1.

The case 1 has an opening 7 and contains a rotary mechanism portion therein under the opening 7. The rotary electric device as shown in FIGS. 1 and 2 is a trimmer capacitor, and hence the rotary mechanism portion is formed by a dielectric member 8 serving as a stator and a metal rotor 9, a spring 10 and a driver plate 11 forming parts of a rotor respectively and successively from the bottom in FIG. 2. The dielectric plate 8 is immovably positioned in the case 1 and is provided in its lower surface with a substantially semicircular electrode conductor 12 which is in contact with the terminal 2. The metal rotor 9 has a rotor electrode 13 which is opposed to the electrode conductor 12 through the dielectric plate 8 such that the area of opposition to the electrode conductor 12 is changed by rotation of the metal rotor 9. The metal rotor 9 is provided in its upper surface with a groove 14 for receiving the spring 10, thereby to prevent rotation of the same with respect to the metal rotor 9. The driver plate 11 is caulked in its lower end to mechanically fix it to the spring 10. The driver plate 11 is provided with an adjusting groove 15 which is in the form of a cross in general as clearly shown in FIG. 1.

In the aforementioned structure, when, for example, the forward end of a screwdriver is engaged in the adjusting groove 15 of the driver plate 11 to rotate the same, the metal rotor 9 is rotated through the spring 10. Therefore, the area of opposition of the electrode conductor 12 and the rotor electrode 13 is changed, thus enabling adjustment of capacitance. This capacitance is externally accessible by the terminal 2 which is in contact with the electrode conductor 12 and by the terminal 3 connected through the driver plate 11, the spring 10, and the metal rotor 9 which are all electrically connected to one another.

The trimmer capacitor thus constructed is provided with a cover sheet 16 bonded to the inner peripheral surface of the edge portion of the opening 7 defined in the case 1 as shown in FIG. 2. The cover sheet 16 is illustrated as transparent in FIG. 1 for allowing recognition of the interior of the case 1. It is advantageous to have a transparent cover sheet 16, so that positions of rotation of the driver plate 11 and the metal rotor 9 can easily be recognized from outside the case 1.

The cover sheet 16 is preferably formed by a thermosetting silicone adhesive having a heat resistance sufficient to withstand the temperature of melted solder (e.g., resistant to immersion in a molten solder tank at a temperature of 270° C. for 20 seconds), and an elasticity and adhesive strength which are produced, respectively after hardening. Such thermosetting resin is employed for facilitating the steps of forming the cover sheet as hereinafter described. Within the group of thermosetting resin, further, the hardening process of a hot setting adhesive can be more readily time-controlled in comparison with that of a room temperature setting adhesive, whereby a production time savings is realized.

An embodiment of a method of forming the cover sheet 16 with reference to FIGS. 3 to 6 is described below.

FIG. 3 shows a step of forming a film. A film 17 is deposited in even thickness on a base plate 18 whose flatness is lower than 0.05, e.g., a double-fluid thermosetting silicone adhesive. The base plate 18 may or may not be provided in the form of a flexible sheet. The same applies to other base plates 18 described below. The film 17 must hold its form so that its thickness etc. is not changed before hardening, and hence it is made of material having high viscosity of, e.g., about 10000 to 400000 cps. The thickness of the film 17 is selected to be about 0.05 to 0.5 mm although the value can be changed as desired. Such thickness is related to extension strength and breaking strength of the cover sheet 16 as hereinafter described, and is appropriately adjusted to obtain desired extension strength and breaking strength. The base plate 18 is prevented from adhering to the film 17. For example, the base plate 18 itself is made of Teflon (trade name) or coated by the same.

Then, a pressing step is carried out as shown in FIG. 4. A rotary electric device 19 such as a trimmer capacitor is placed on the film 17 with the opening 7 of the case 1 facing the film 17. It is to be understood that the rotary electric device 19 corresponds to the trimmer capacitors shown in FIGS. 4 to 7 illustrated in FIGS. 1 and 2. Visible in the case 1 in FIGS. 4-7 is a part of the driver plate 11. However, it is to be noted that these drawings are modified to some extent in size to facilitate understanding of the respective steps. Shown in the upper portion of the case 1 are the terminals 2 and 3, which are bent downwardly from their positions as shown in FIG. 2 along the case 1 to have a form of a chip. In the state as shown in FIG. 4, the film 17 is still not hardened. Therefore, when pressure 20 is applied from the bottom side of the case 1, the edge portion of the opening 7 penetrates into the film 17, which in turn is partially brought into contact with the inner peripheral surface of the edge portion of the opening 7. Thus, the resin material is introduced into the opening 7 to form the cover sheet for closing the opening 7. In the present embodiment, the pressure 20 is of sufficient magnitude so that the edge portion of the opening 7 is brought into contact with the base plate 18 and severs the film 17. Within the case 1, the driver plate 11 is partially in contact with or embedded in the film 17. To this end, the upper surface of the driver plate 11 is preferably positioned to be lower than that of the case 1 by about 0.05 to 0.1 mm.

When the step as shown in FIG. 4 is performed, the base plate 18 is simultaneously heated from the direction indicated by arrows 21. The heating temperature and duration on the material forming the film 17, and in case of, e.g., a silicone adhesive, the base plate 18 is heated at a temperature of 130° to 150° C. When the state as shown in FIG. 4 is maintained for a predetermined time, the resin forming the film 17 begins to harden. The base plate 18 is heated until the resin forming the film 17 is half-hardened, i.e., the heating operation is stopped in a state that the adhesive strength of the resin is not yet sufficient, and thereafter the base plate 18 is temporarily cooled. For example, such a half-hardened state of the resin is obtained by heating at a temperature of 130° C. for four minutes when the film 17 is formed of a hot setting silicone adhesive.

Then a separation step is performed as shown in FIG. 5 by separating the rotary electric device 19 from the base plate 18. Consequently, a portion of the film 17 forming the cover sheet is separated from the base plate 18 with the case 1. The other portion of the film 17 which is in contact with the outer peripheral surface of the case 1 is readily separated from the case 1 since its adhesive strength is not yet sufficient, and hence the aforementioned portion of the film 17 alone is now in contact with the rotary electric device 17. Thus, simultaneously with the separation step the unnecessary portion of the film 17 in the outer peripheral portion of the edge of the opening 7 is also removed.

Then a subsequent step is performed as shown in FIG. 6 for hardening the film 17 introduced into the opening 7 of the case 1. In this step, the film 17 is heated to be completely hardened, whereby the cover sheet 16 is formed in a state bonded to the inner peripheral surface of the edge portion of the opening 7 in the case 1. Thus, the rotary electric device 19 is obtained in the form closed by the cover sheet 16.

In the aforementioned embodiment, the silicone adhesive is employed as the material for the cover sheet 16. Therefore, the cover sheet 16 itself has elasticity for allowing insertion of a screwdriver, etc., into the driver plate 11 with, e.g., a force which is smaller than 50 gf. The thickness of the cover sheet 16 is about 0.05 to 0.5 mm, and when the driver plate 11 is rotated by the screwdriver, the cover sheet 16 is readily broken between the inner peripheral surface of the case 1 and the outer peripheral surface of the driver plate 11 as indicated at 22 in FIG. 7 without requiring high torque. For example, the cover sheet 16 can be broken with torque lower than 150 g.cm. Further, even if the break line is formed in the position as shown by numeral 22, no wide clearance is defined since the most part of the cover sheet 16 is retained by the driver plate 11, whereby the rotary electric device 19 is protected from dust after adjustment. The silicone adhesive may be prepared by single-fluid room temperature setting resin.

Although the cover sheet 16 is broken by adjustment in the above description, it may be merely extended or partially broken. The change in the cover sheet 16 by the adjusting operation depends on factors such as the material for the cover sheet 16 and the thickness thereof.

In the aforementioned embodiment, the case 1 and the cover sheet 16 are made of resin which is resistant to the high temperature encountered during exposure to molten solder, and hence the rotary electric device according to the present invention can satisfactorily be passed through the molten solder tank.

An important feature of the present invention is that the cover sheet is formed in a state wherein it is bonded to the inner peripheral surface of the edge portion defining the opening in the case. Therefore, the form of the cover sheet is not restricted to that shown in FIG. 2, and the cover assumes the shape of the opening defined in the case.

Figure 8:
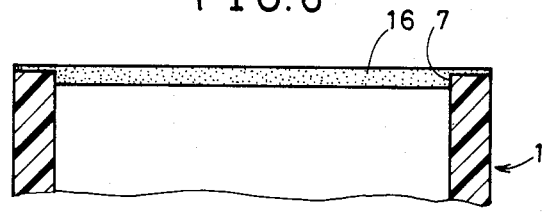
FIGS. 8 to 10 are schematic cross-sectional views respectively showing modifications of the cover sheet 16 in relation to an opening defined in a case 1.

In an embodiment shown in FIG. 8, a cover sheet 16 is bonded to the inner peripheral surface of the edge portion defining the opening 7 in a case 1 of a rotary electric device. The cover sheet extends over the upper end surface of the edge portion defining an opening 7. Formation of such a cover sheet 16 is made possible by changing the pressure 20 as described above with reference to FIG. 4. According to this modified example, the area of contact between the cover sheet 16 and the case 1 is increased whereby the adherability between the cover and the case is increased, leading to improved sealing of the rotary electric device.

Figure 9:
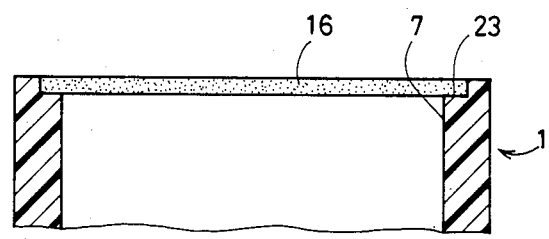

As shown in FIG. 9, the edge portion defining an opening 7 in a case 1 may be provided in its inner periphery with a stepped portion 23, to provide a base for the cover sheet 16. Also in this case, the cover sheet 16 is bonded to the inner peripheral surface of the edge portion defining the opening 7. The area of contact between the cover sheet 16 and the case 1 is also increased by this modification.

Figure 10:
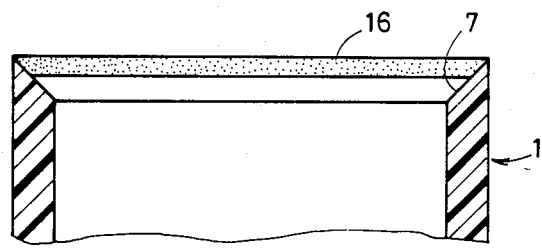

In FIG. 10, the inner peripheral surface of the edge of the opening 7 in the case 1 is defined by an inclined surface. Therefore, a cover sheet 16 is bonded to the inner peripheral surface of the edge of the opening 7 having the inclined surface. In this embodiment, a knife edge is thus formed around the opening 7 of the case 1, and hence the film 17 can be severed without requiring excessive pressure 20 in the aforementioned step as shown in FIG. 4.

Although the terminals 2 and 3 are integrally molded with the case 1 in each of the aforementioned embodiments, formation of the terminals 2 and 3 is not restricted to such integral molding. In substitution therefor, the case 1 may be provided with holes for receiving terminals 2 and 3, and further, the holes for receiving the terminals 2 and 3 may be filled up with an adhesive. Further, each of the aforementioned embodiments is applied to a trimmer capacitor and hence the stator 8 serving as the dielectric member is inserted in the case, whereas a part of the case 1 may be utilized as a stator in another type of rotary electric device.

Figure 11:
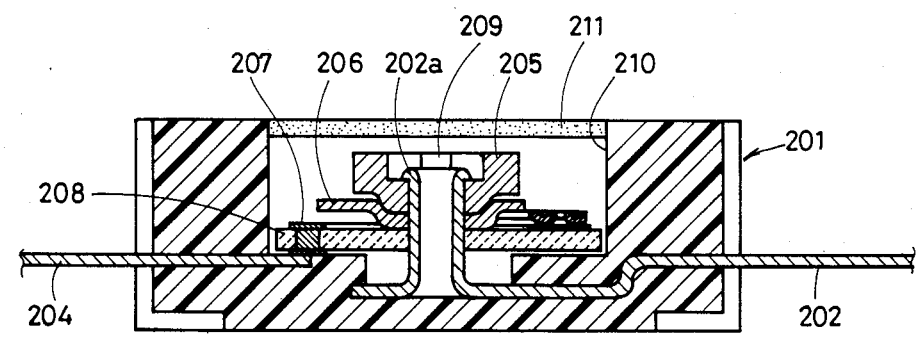
FIG. 11 is a longitudinal sectional view showing a variable resistor according to another embodiment of the present invention.

FIG. 11 shows a variable resistor formed as a rotary electric device to which the present invention is applied.

A case 201 of heat-resistant resin formed with terminals 202 and 204 embedded therein. An end of the terminal 202 located in the case 201 is provided in the form of a throttle grommet 202a, to supply an axis of rotation for a rotor 205 and a slider 206. An end of the other terminal 204 located in the case 201 is partially exposed on the bottom inner surface of the case 201. A stator 208 having a resistance film 207 connected with the terminal 204 is placed on the bottom of the case 201. The slider 206 and the rotor 205 are successively placed on the stator 208, and the upper end of the throttle grommet 202a is caulked thereby to retain the components.

A screwdriver or the like engages the adjusting groove 209 defined in the upper surface of the rotor 205, to rotate the rotor 205 thereby providing means for changing the resistance value.

In such a variable resistor, a cover sheet 211 is formed to close an opening 210 of the case 201. The cover is bonded to the inner peripheral surface of the opening 210. The cover sheet 211 may be formed of the same material and with the same method as described with reference to the aforementioned embodiments.

In the variable resistor as shown in FIG. 11, a clearance is defined between the cover sheet 211 and the rotor 205.

In this variable resistor, the terminals 202 and 204 may be severed in appropriate length and downwardly bent along the case 201 to make the resistor in the form of a chip-like component.

Although the present invention has been described and illustrated in detail, it is intended that the description is by way of illustration and example only and is not to be taken by way of limitation, the spirit and scope of the present invention being limited only by the terms of the appended claims.

What is claimed is:

1. An electric device comprising a rotary mechanism portion including rotor means and stator means contained in a case having an opening for receiving a tool for rotating said rotor means;
   said electric device including a cover sheet formed in a state bonded to the inner peripheral surface of an edge portion defining said opening for closing said opening; and
   said cover sheet being formed of a material having elastic and heat resisting properties, so as to be easily breakable for receiving such tool through said cover sheet.

2. An electric device comprising:
   a case and an opening through the case;
   a stationary electrical component in the case;
   a rotatable component coupled to the stationary component and operable for changing at least one electrical parameter associated with said device, said rotatable component being exteriorly accessible through said opening for being rotated; and
   a cover sheet affixed to an inner peripheral surface of an edge portion which defines said opening to thereby enclose said opening;
   wherein said cover sheet is formed to be easily broken for rotation of said rotatable component through said cover sheet.

3. An electric device comprising:
   a case and an opening through the case;
   a stationary electrical component in the case;
   a rotatable component coupled to the stationary component and operable for changing at least one electrical parameter associated with said device, said rotatable component being exteriorly accessible through said opening for being rotated; and
   a cover sheet affixed to an inner peripheral surface of an edge portion which defines said opening to thereby enclose said opening;
   said cover sheet being formed of a material having elastic and heat resisting properties, so as to be easily breakable for rotation of said rotatable component through said cover sheet.

4. An electric device in accordance with claim 2, wherein said material for forming said cover sheet is a thermosetting resin.

5. An electric device in accordance with claim 4, wherein said thermosetting resin is a silicone adhesive.

6. An electric device in accordance with claim 5, wherein said silicone adhesive is a hot setting type silicone adhesive.

7. An electric device in accordance with claim 5, wherein said silicone adhesive is capable of setting at temperatures.

8. An electric device in accordance with claim 3, wherein said cover sheet is extendable.

9. An electric device in accordance with claim 3, wherein said cover sheet is formed to be flush with said edge portion defining said opening.

10. An electric device in accordance with claim 3, wherein said cover sheet extends over an end surface of said edge portion defining said opening.

11. An electric device in accordance with claim 3, wherein said edge portion defining said opening is provided in its inner periphery with a stepped portion, and said cover sheet is affixed to said stepped portion.

12. An electric device in accordance with claim 3, wherein said edge portion defining said opening is formed by an inclined surface, and said cover sheet is bonded to said inclined surface.

13. An electric device in accordance with claim 3, wherein said cover sheet is bonded to at least a part of said rotor means.

14. An electric device in accordance with claim 3, wherein said cover sheet is spaced from said rotor means.

15. An electric device in accordance with claim 3, further including at least two terminal means electrically communicating with said rotor means and said stator means respectively,
   said terminal means being integrally molded with said case.

16. An electric device in accordance with claim 3, wherein said electric device is a trimmer capacitor.

17. An electric device in accordance with claim 3, wherein said electric device is a variable resistor.

* * * * *